United States Patent [19]
Jacobson et al.

[11] Patent Number: 6,121,787
[45] Date of Patent: Sep. 19, 2000

[54] ELECTRONIC TEST APPARATUS

[75] Inventors: Tyland L. Jacobson, Escondido; William R. Pond, San Diego, both of Calif.

[73] Assignee: Micro Instruments Company, Escondido, Calif.

[21] Appl. No.: 09/182,296

[22] Filed: Oct. 29, 1998

Related U.S. Application Data

[62] Division of application No. 08/681,110, Jul. 22, 1996, abandoned.

[51] Int. Cl.$^7$ .................................................. G01R 31/28
[52] U.S. Cl. ............................................................. 324/765
[58] Field of Search .................................. 324/765, 768, 324/769, 158.1

[56] References Cited

U.S. PATENT DOCUMENTS 5,701,666  12/1997  DeHaven et al. ...................... 324/765

*Primary Examiner*—Ernest Karlsen
*Attorney, Agent, or Firm*—Nydegger & Associates

[57] ABSTRACT

An apparatus for testing an electrical device, having a high side terminal and a low side terminal, includes a power source which is connected to the high side terminal. A voltage monitor is also connected to the high side terminal to determine the voltage that is input to the device. Additionally, a current monitor is connected to the low side terminal to determine the current that passes through the device. A processor is connected to the power source, to the voltage monitor, and to the current monitor. Using the voltage input to high side terminal, and the through current from the low side terminal, the processor computes algorithmic functions which are compared with a predetermined value to establish an error signal. The apparatus then uses this error signal to control the input voltage from the power source to the high side terminal of the device.

2 Claims, 2 Drawing Sheets

ELECTRONIC TEST APPARATUS

This application is a divisional of application Ser. No. 08/681,110 filed Jul. 22, 1996, now abandoned. The contents of application Ser. No. 08/681,110 are incorporated herein by reference.

FIELD OF THE INVENTION

The present invention pertains to electronic testing equipment. More specifically, the present invention pertains to quality control testing for high production volume electronic devices. The present invention is particularly, but not exclusively useful for electromigration and oxide breakdown testing of semiconductors.

BACKGROUND OF THE INVENTION

For high production volume electronic devices it is important that quality control be properly monitored. This is so regardless of whether the device being tested presents a complex load or a sensitive load. For purposes of the present invention, a complex load is one having a multitude of major current carrying terminals that must be at different voltages. On the other hand, a sensitive load is one that is easily subject to unwanted damage or undesirable changes due to slight deviations in voltage, current, power, heating, frequency, or any other applied electrical quantity other than specified.

The importance of test monitoring is at least two-fold. First, it is necessary to know that the product actually works as intended and, secondly, it is necessary to know that it will work reliably for an extended period of time. It is, of course, quite impractical to subject a product to a simulated operational environment for the entire life expectancy of the product. In some instances this could require years. In fact, the life expectancy of the product may not even be known, and may itself be an objective of the testing. Consequently, accelerated or destructive testing is done to determine long term reliability of the product within a relatively short period of time. As implied above, this testing must be done reliably, predictably and precisely.

Semiconductor testing provides an example where the long term electromigration and oxide breakdown characteristics of an electronic device, the semiconductor, can be tested in a relatively short period of time. Typically, this testing is done by applying a substantially constant current through the device. To accomplish this, the input current to the device is monitored and is appropriately adjusted to maintain the current at a substantially constant value. Unfortunately, testing equipment which uses such a scheme can sometimes prematurely destroy the device being tested, before it can be effectively tested. Primarily such destruction is caused by current surges through the device which result from erratic interruptions in the test circuitry. Not surprisingly, tests can sometimes require relatively high current levels. If so, the damage can be extensive.

Environmental conditions during a test, such as unwanted vibrations on either the test equipment or the device being tested, can cause erratic interruptions. When such an interruption occurs, the current through the device being tested will diminish or be entirely cut off. In response, the voltage which is being applied to maintain a substantially constant current through the device being tested will increase dramatically. A reconnection of the circuitry after the interruption then results in a current surge and possible destruction of the device. The test results are consequently unusable. Unfortunately, all of this can happen before any software which is being used to monitor the test circuitry can establish proper control. Further, as will be appreciated by the skilled artisan, voltage and current fluctuations can also cause damage to the test apparatus itself.

In light of the above, it is an object of the present invention to provide an apparatus for testing an electrical device which obviates current surges through the device by controlling the voltage input to the device. Another object of the present invention is to provide an apparatus for testing an electrical device which is capable of applying a regimen of carefully controlled and monitored electric power to either a complex load or a sensitive load. Another object of the present invention is to provide an apparatus for testing an electrical device which has the flexibility to conduct various test procedures or protocols on the device, to include tests using relatively high current levels. Yet another object of the present invention is to provide an apparatus for testing an electrical device which prevents damage to the test apparatus itself. Still another object of the present invention is to provide an apparatus for testing an electrical device which is relatively simple to manufacture, is functionally easy to use, and is comparatively cost effective.

SUMMARY OF THE PREFERRED EMBODIMENTS

In accordance with the present invention, an apparatus for testing an electrical device includes a power source which is connected directly to the high side terminal of the device to be tested. The so-called "high side" designation is given here to terminals of the device where the highest voltages occur. It follows that the device terminal(s) at ground is(are) called the "low side" terminal. Additionally, the apparatus includes a current monitor which is connected to the low side terminal of the device. The current monitor for the low side terminal, and the power source to the high side terminal, are both connected to a processor. Specifically, the current monitor is used to determine the current which flows through the device. The processor then uses information regarding this through current for computation of a mathematical function which the processor uses to control the voltage that is input to the high side terminal of the device.

The apparatus of the present invention also includes load current limiters which are connected between the low side terminal of the device and the current monitor and placed in the power source. These current limiters can also be connected to, and controlled by, the processor. They function to protect the current measurement circuitry of the apparatus, and to some extent the test device, from damage or malfunction due to excessive voltage or current. In the case of the low side current limiters, their primary function is to confine current output from the device within a preselected range. In the case of the power source current limiters, their function is to prevent damage to the power source which might result in leads to the device are accidentally shorted to ground.

For the present invention the power source can include both a power supply and a regulator or driver. Both the regulator and the power supply are connected to, and controlled by, the processor. Within the power source, the regulator can then be operated to control the power supply in either an open loop mode or in a local negative voltage feedback mode. In the open loop mode, the power supply is directly set by the regulator to provide a substantially constant input voltage to the high side terminal of the device being tested. In the local negative voltage feedback mode, the regulator compares voltage from the power supply with voltage at the high side terminal to create an error signal. This error signal is then used to vary the voltage from the power supply to maintain a substantially constant voltage at the high side terminal.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENT

Figure 1:
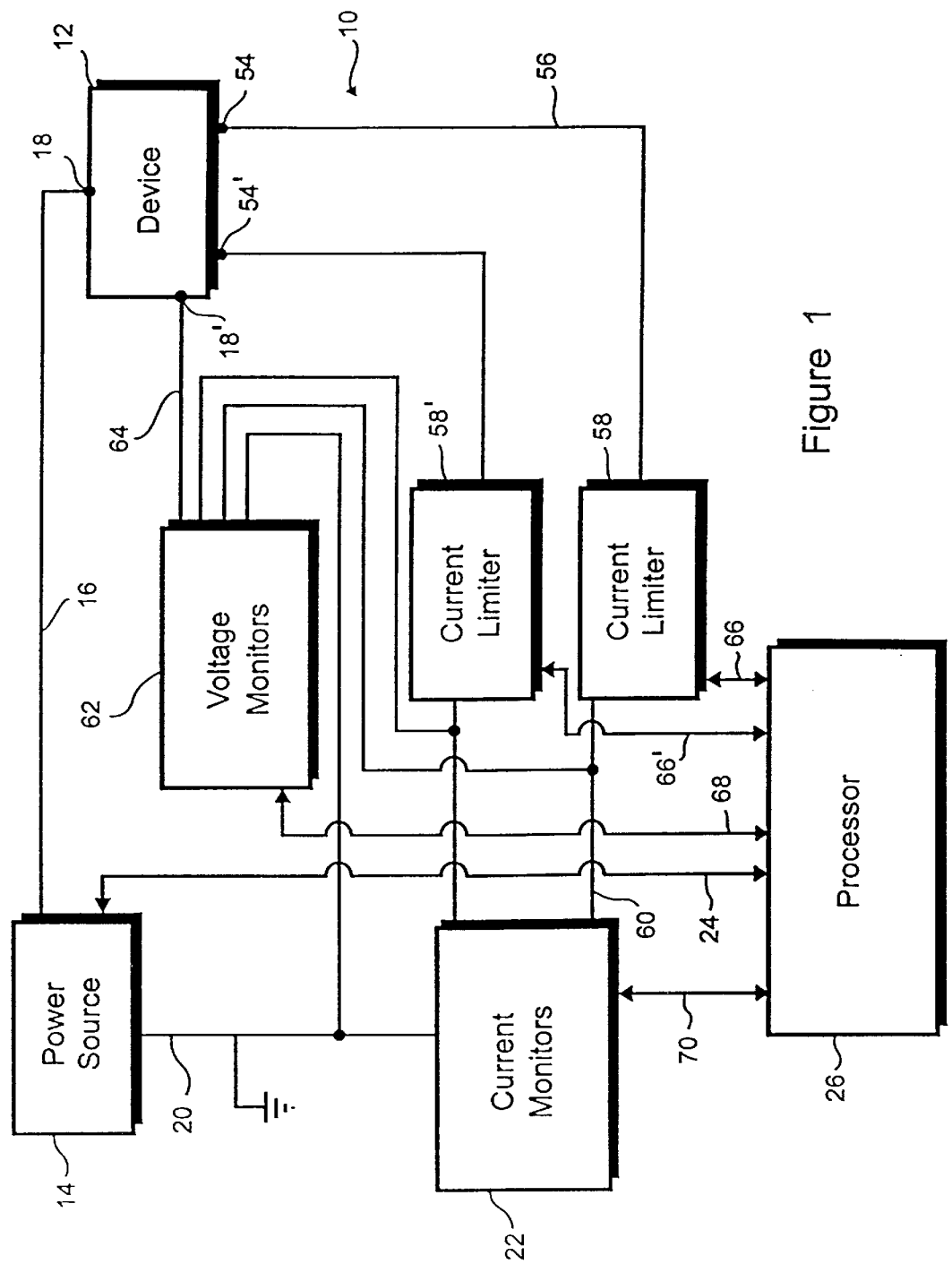
FIG. 1 is a schematic diagram of the component configuration for the electronic device testing apparatus of the present invention.

Referring initially to FIG. 1, an apparatus for testing an electronic device in accordance with the present invention is shown and generally designated 10. As shown in FIG. 1, the apparatus 10 is to be used to test a device 12. For this purpose, the apparatus 10 includes a power source 14 which is designed to apply a regime of carefully controlled and regulated power. In detail, the power source 14 is connected via a line 16 to the high side terminal 18 of the device 12. For purposes of the present invention the terminal 18 is designated as being "high side" because this is where the highest voltages are to occur. FIG. 1 also shows that power source 14 is also connected via a line 20 to current monitors 22 and it is connected via a line 24 to a processor 26. In order to better appreciate the components of power source 14, reference is made to FIG. 2.

Figure 2:
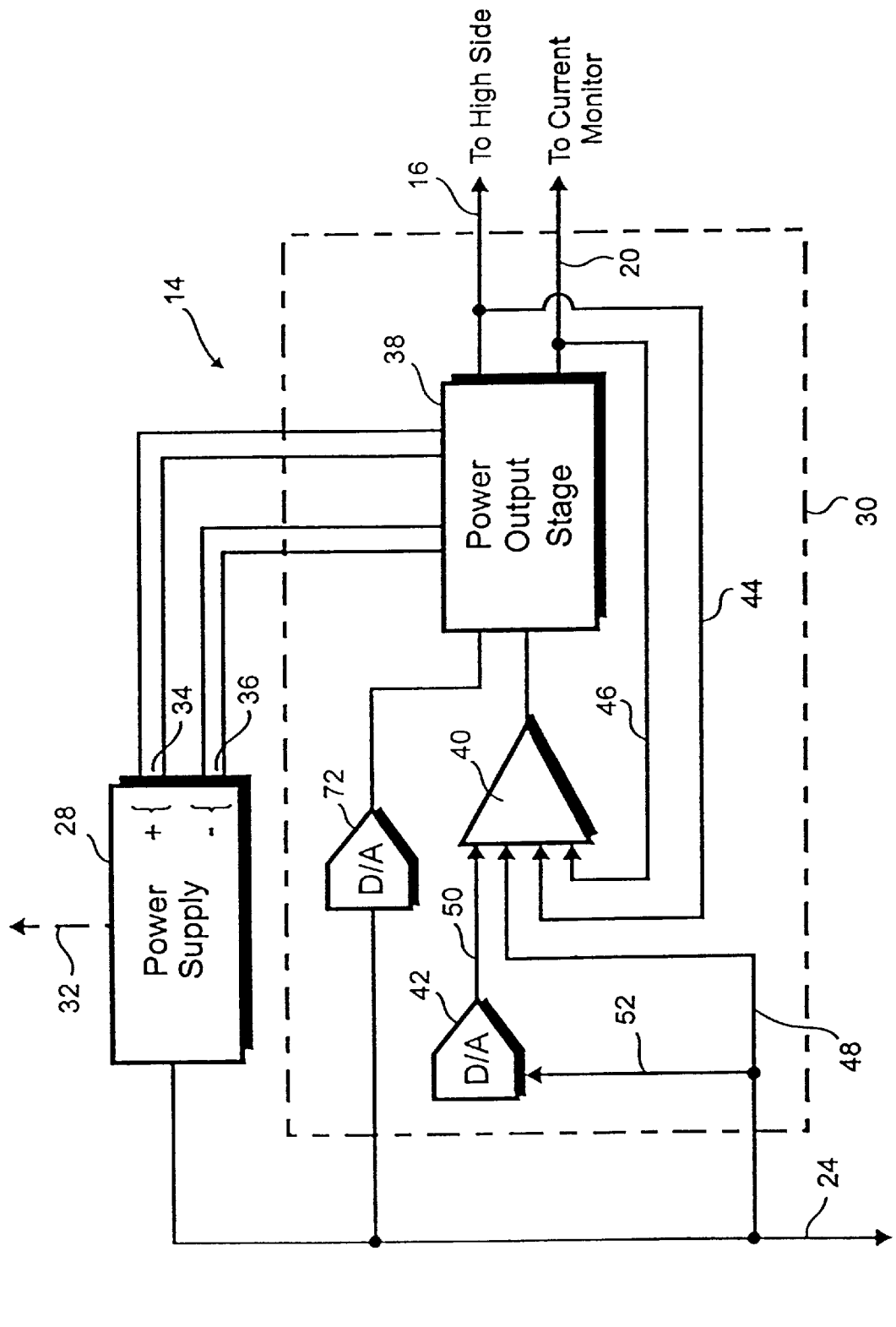
FIG. 2 is a schematic diagram of the power source of the testing apparatus of the present invention.

In FIG. 2, it will be seen that the power source 14 includes both a power supply 28 and a regulator 30. Further, a line connector 32 is provided with power supply 28 for access to power from a primary source (not shown). As contemplated by the present invention, the power supply 28 can be distanced from the regulator 30 and placed in a location where heat can be dissipated conveniently. Power dissipation in the regulator 30 itself is minimized by setting the power supply 28 to the least practicable voltage for expected conditions in the device 12.

In order to provide some flexibility for apparatus 10, the power supply 28 has the capability for both a positive voltage output 34 and a negative voltage output 36, both of which are respectively connected to a power output stage 38 that is located in the regulator 30. Also found in the regulator 30 are a reconfigurable amplifier 40 and a digital to analog converter 42. As shown, inputs to the reconfigurable amplifier 40 include: i) the voltage on high side terminal 18 via a local feedback line 44, ii) the voltage to current monitors 22 via a local feedback line 46, iii) input signals from processor 26 via line 48, and iv) an analog signal from converter 42 via line 50. Further, FIG. 2 shows that the converter 42 also receives a direct signal from processor 26 via line 52. Within the reconfigurable amplifier 40, the switch matrix that is controlled by processor 26 can disconnect and reconnect subcomponents of the amplifier 40 in a manner well known by those skilled in the art. Specifically, the reconnections can be accomplished to establish a variety of useful configurations for the amplifier 40.

With the configuration shown in FIG. 2, the regulator 30 is of simultaneous voltage and current limiting design. Specifically, through its connection with processor 26, limits can be set for regulator 30 for both voltage and current. The purpose of these limits is to prevent sudden accidental damage to device 12 or invalidation of a programmed load power sequence which might be caused by brief changes in load conditions. More specifically, the set limits are intended to account for changes in load conditions which are too rapid for corrective action by the real time control loop of processor 26.

FIG. 2 also indicates that the regulator 30 can operate either open loop or closed loop. In the local negative feedback closed loop mode, the reconfigurable amplifier 40 receives negative feedback from the power output stage 38 regarding the voltage going to high side terminal 18. Information about this voltage is fed back to amplifier 40 via the line 44 where it can be compared with information from processor 26 regarding a desired voltage. With this comparison, an error signal can be generated to correct the voltage coming from the power supply 28 and maintain this input voltage from power supply 28 to high side terminal 18 at a desired level. Information from the power output stage 38 which is being sent to current monitors 22 can also be used as negative feedback to amplifier 40 for this same purpose. In the open loop mode, these feedbacks can be ignored.

For particular tests wherein very high currents are required to appropriately test the device 12, it will be understood by the skilled artisan that exceptionally low impedances are required in order to get accurate voltage and current measurements. For such tests, processor 26 can be programmed to switch the current limiters 58 to a low impedance state wherein they cannot respond rapidly to current surges. Alternatively, processor 26 can simply turn off the limiters 58. Under these conditions, current limiters which are adjustable under the control of processor 26 are built into the power source 30 to govern the maximum current through device 12.

FIG. 2 further indicates that the regulator 30 includes a digital to analog converter 72 which is connected between processor 26 and power output stage 38 to control current limiting of the power output stage 38. Accordingly, as stated above, the apparatus 10 includes current limiters which limit either, or both, the current from the low side terminal 54 of device 12 and the current to high side terminal 18 of the device 12.

In addition to the positive voltage output 34 and the negative voltage output 36, the flexibility of the apparatus 10 is further enhanced by allowing for selection of one of two output voltage ranges. One range, +/−10 volts, is a low range which is compatible with the low voltage components used in the amplifier 40. The other range, +/−100 volts, is sufficient to accommodate the maximum voltage output capability of the regulator 30 and the power supply 28.

Returning now to FIG. 1, it will be seen that the device 12 has a low side terminal 54 which is connected via a line 56 to a current limiter 58. In contrast with the "high side", the "low side" here refers to those leads which are connected to ground, virtual ground or a common return. The low side terminal 54' and current limiter 58' are shown as being representative of the fact that device 12 can have several low side terminals 54, and that the apparatus 10 is capable of handling this plurality of low side terminals 54. Further, it will be seen that the current limiter 58 is connected via a line 60 to current monitor 22.

A voltage monitor 62 is connected via a line 64 to the device 12 and is provided for accurate sensing of load voltages on the device 12. More specifically, the voltage monitor 62 is attached at an appropriate high side terminal 18' to minimize or eliminate substantial errors which could otherwise be introduced by the impedance in major current carrying leads. For purposes of the present invention, voltage monitor 62 can be of a type well known in the art, such as a Kelvin terminal. It is to be appreciated that the voltage monitor 62 need not be operated continuously. Instead, voltage monitor 62 can be controlled by processor 26 and selectively activated according to the particular desires of the operator and the requirements of the test regime.

A key aspect of the apparatus 10 of the present invention is that the processor 26 is able to control all of the components. As mentioned above, processor 26 is directly connected to power source 14 via the line connector 24. Additionally, processor 26 is directly connected to i) the current limiters 58 via line connector 66, ii) the voltage monitors 62 via line connector 68, and iii) the current monitors 22 via line connector 70. For purposes of the present invention, the processor 26 can be of any type well known in the pertinent art such as a computer, a microprocessor, a digital signal processor, or an assemblage of processors. The primary purpose of the dedicated processor 26 is to maintain control of electrical conditions in the apparatus 10, and to control component operations within the apparatus 10 with minimal diversions.

OPERATION

In the operation of the apparatus 10 of the present invention, the apparatus 10 is connected to both the high side terminal 18 and the low side terminal 54 of the device 12 to be tested. In accordance with preprogrammed instructions from the processor 26, the power source 14 applies a voltage to the high side terminal 18. It is to be appreciated that these preprogrammed instructions can be based on any of several testing regimes, all of which are selectable by the apparatus 10 operator. As a practical matter any particular regime of these instructions can contain variations in voltage and current requirements during particular time periods.

As the voltage from power source 14 is being applied to the high side terminal 18 of device 12, the processor 26 monitors the through current at low side terminal 54 of device 12. In accordance with preprogrammed instructions, processor 26 uses information regarding the through current from device 12 to generate a mathematical or algorithmic function. Specifically, the mathematical function generated by processor 26 is based upon input from the operator that details the particular test regime for device 12. As is well appreciated by the skilled artisan the profile of test regimes can be many and varied. In any event, during testing, the current limiters 58 are ensuring that current in the apparatus 10 of the device 12 are at safe values for the current range that is selected. Also, the regulator 30 includes design features which limit both current and voltage in the apparatus 10 to appropriate levels. In sum, the apparatus 10 is intended to challenge and test the device without causing undesirable damage.

While the particular apparatus for testing an electrical device as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A method for challenging and testing an electrical device having a high side terminal and a low side terminal which comprises the steps of:

providing power to establish and maintain an input voltage and an input current for said device at said high side terminal;

monitoring said input voltage at said high side terminal;

measuring a through current for said device at said low side terminal;

computing a mathematical function using said voltage input and said through current; and comparing said mathematical function with a predetermined value to vary said input voltage to a non-zero voltage.

2. A method as recited in claim 1 wherein said power is maintained open loop.

* * * * *